(12) United States Patent
Yuki

(10) Patent No.: US 11,173,855 B2
(45) Date of Patent: Nov. 16, 2021

(54) ELECTRIC DEVICE INSTALLATION STRUCTURE IN VEHICLE

(71) Applicant: TOYOTA JIDOSHA KABUSHIKI KAISHA, Toyota (JP)

(72) Inventor: Keisuke Yuki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 94 days.

(21) Appl. No.: 16/516,704

(22) Filed: Jul. 19, 2019

(65) Prior Publication Data

US 2020/0070755 A1 Mar. 5, 2020

(30) Foreign Application Priority Data

Aug. 28, 2018 (JP) .............................. JP2018-159695

(51) Int. Cl.
| | | |
|---|---|---|
| *B60R 16/02* | (2006.01) | |
| *B60R 16/023* | (2006.01) | |
| *H01R 13/621* | (2006.01) | |
| *H05K 5/03* | (2006.01) | |
| *H05K 5/02* | (2006.01) | |
| *B60K 6/22* | (2007.10) | |

(52) U.S. Cl.
CPC ..... *B60R 16/0239* (2013.01); *H01R 13/6215* (2013.01); *H05K 5/0247* (2013.01); *H05K 5/03* (2013.01); *B60K 6/22* (2013.01); *B60Y 2200/92* (2013.01)

(58) Field of Classification Search
CPC . B60R 16/0239; B60R 16/02; H01R 13/6215; H01R 13/52; H01R 13/5213; H01R 12/716; H01R 13/502; H01R 13/5202; H01R 13/73; H01R 2201/26; H05K 5/03; H05K 5/0247; H05K 5/0069; H05K 7/1432; H05K 5/0026; H05K 7/1427; B60Y 2200/92; B60K 6/22; B60K 6/445; B60K 6/405; H02M 7/003
See application file for complete search history.

(56) References Cited

U.S. PATENT DOCUMENTS

| | | | | |
|---|---|---|---|---|
| 2002/0157848 | A1* | 10/2002 | Chiriku | B60R 16/0238 174/50 |
| 2005/0167183 | A1* | 8/2005 | Tominaga | H05K 7/1432 180/444 |
| 2011/0265341 | A1* | 11/2011 | Young | H05K 5/0069 33/613 |
| 2013/0037335 | A1* | 2/2013 | Sakamoto | H05K 5/0204 180/65.8 |
| 2013/0135841 | A1* | 5/2013 | Pavlovic | H05K 9/0047 361/818 |

(Continued)

FOREIGN PATENT DOCUMENTS

| | | |
|---|---|---|
| JP | 2015-204688 A | 11/2015 |
| JP | 2018-023217 A | 2/2018 |

*Primary Examiner* — Steven T Sawyer
(74) *Attorney, Agent, or Firm* — Oliff PLC

(57) ABSTRACT

An electric device installation structure in a vehicle includes an electric device configured to be fixed on a vehicle structural object in a front compartment of a vehicle. A cover is attached to an upper part of a case of the electric device. A first connector projects from a rear portion of the cover. A projection is provided on a rear surface of the case, the projection extending upward to a position above a boundary between the case and the cover.

4 Claims, 5 Drawing Sheets

(56) References Cited

U.S. PATENT DOCUMENTS

| | | | | |
|---|---|---|---|---|
| 2015/0121767 A1* | 5/2015 | Nagamori | ............... | H05K 5/03 |
| | | | | 49/463 |
| 2015/0305177 A1* | 10/2015 | Nakashima | .......... | H05K 5/0204 |
| | | | | 310/68 D |
| 2017/0018939 A1* | 1/2017 | Shiba | ................... | H02J 7/0029 |
| 2017/0121936 A1* | 5/2017 | Nagano | ................ | E02F 9/0808 |
| 2018/0254620 A1* | 9/2018 | Kosuga | ............... | H01R 13/502 |
| 2019/0013615 A1* | 1/2019 | Nakamura | ........... | H05K 7/1427 |
| 2019/0200475 A1* | 6/2019 | Tramet | ................ | H05K 5/0017 |

\* cited by examiner

ELECTRIC DEVICE INSTALLATION STRUCTURE IN VEHICLE

INCORPORATION BY REFERENCE

The disclosure of Japanese Patent Application No. 2018-159695 filed on Aug. 28, 2018 including the specification, drawings and abstract is incorporated herein by reference in its entirety.

BACKGROUND

1. Technical Field

The disclosure relates to an electric device installation structure in a vehicle. The disclosure relates especially to a technique that improves shock resistance of a case of the electric device.

2. Description of Related Art

Japanese Unexamined Patent Application Publication No. 2018-023217 (JP 2018-023217 A) discloses an electric vehicle in which an electrical control unit is mounted in a front compartment. The electrical control unit is fixed on a transaxle that houses a motor for traveling. A connector is connected to a rear portion of an upper surface of the electrical control unit. A cowl panel is positioned rearward of the connector. When a vehicle collision occurs and the electrical control unit moves rearward, there is a possibility that the connector may interfere with the cowl panel. In order to protect the connector from interference with the cowl panel, protectors extending to a position rearward of the connector are provided on sides of the connector, respectively. In this disclosure, a "rear portion" and "rearward" of an electrical control unit are based on a front-rear direction of a vehicle in which the electrical control unit is mounted. This also applies to a "front portion", a "side portion", "forward", and "on a side" of the electrical control unit.

SUMMARY

When the protectors are provided on the sides of the connector, respectively, a size of the protector increases. This disclosure provides a structure that is more compact and protects an upper connector. The technique in this disclosure is applicable to an electrical control unit and to general electric devices installed in a vehicle.

This disclosure relates to an electric device installation structure in a vehicle. The electric device installation structure includes an electric device configured to be fixed on a vehicle structural object (another device installed in a vehicle or a part of a vehicle body) in a front compartment of a vehicle. A cover is attached to an upper part of a case of the electric device. A first connector projects from a rear portion of the cover. A projection is provided on a rear surface of the case, the projection extending upward to a position above a boundary (i.e., a boundary at a rear edge of the cover) between the case and the cover. The projection protects the first connector from interference with a structural object positioned rearward of the first connector. Unlike the technique disclosed in JP 2018-023217 A, no protector is provided on sides of the connector, and it is thus possible to reduce the size of the protector. The projection may extend to a position above the first connector. This ensures that the first connector is protected. As stated earlier, the "rear portion" and a "rear surface" are expressions based on the front-rear direction of a vehicle in which the electric device is mounted.

Another connector (a second connector) may be connected to the rear surface of the case of the electric device. The second connector may be fixed by two bolts that are inserted from above. In this case, the projection may be positioned above the second connector so as to project from the rear surface, and the projection may extend upward at a position between the two bolts in a view seen from a rear side. When the two bolts are attached and detached, interference between the projection and the bolts is avoided.

A recess may be provided in a rear edge of the cover, and the projection may extend through the recess. A rib may extend from the rear surface of the case, and the second connector may be fixed to the rib; and the two bolts may be inserted into the rib from above.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
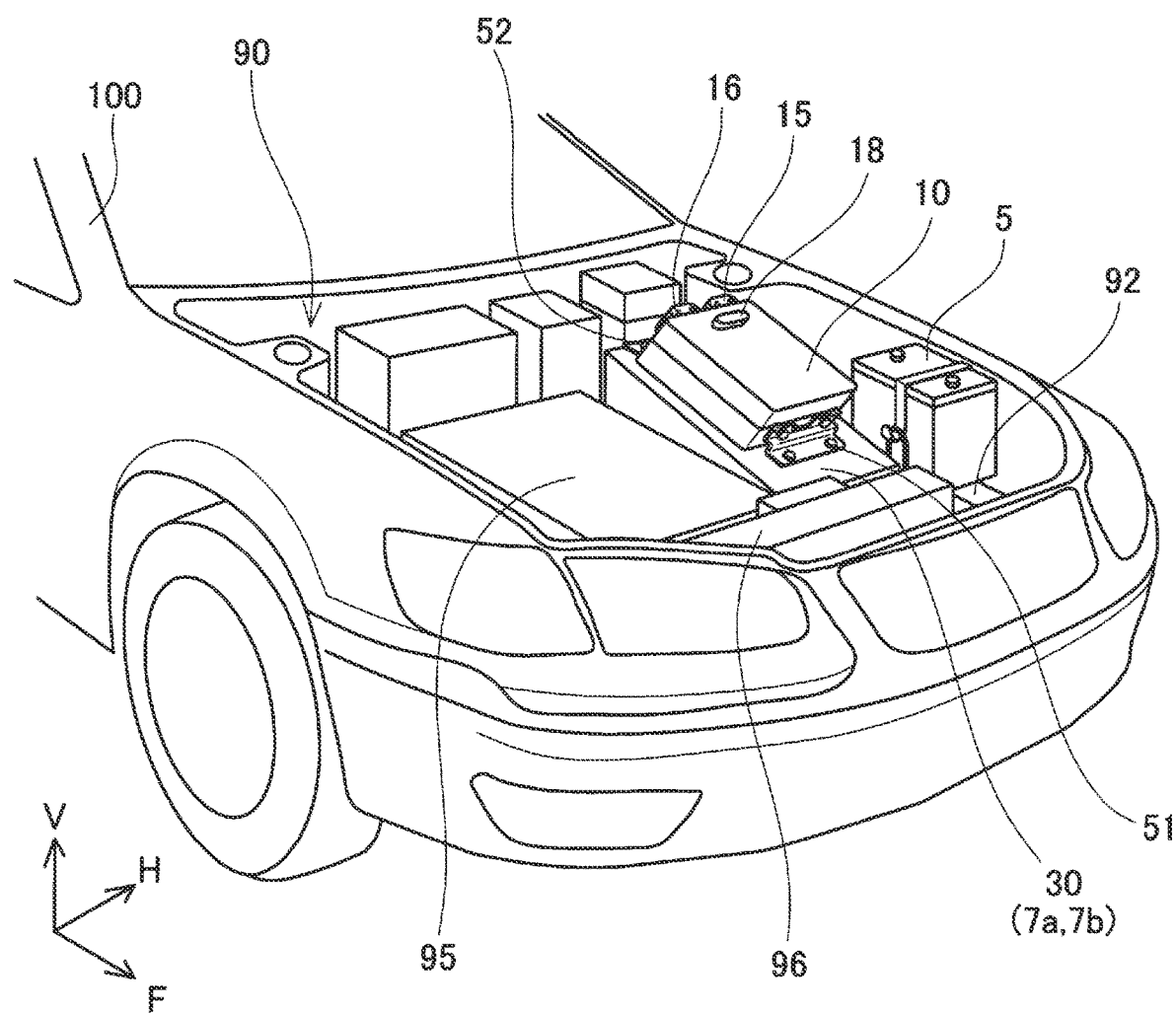
FIG. 1 is a perspective view showing a device layout in an inside of a front compartment of a hybrid car.

An installation structure in a vehicle according to an embodiment is described with reference to the drawings. The installation structure in the vehicle according to the embodiment is applied to an electrical control unit in a hybrid car provided with an engine and a motor for traveling. FIG. 1 is a perspective view showing a device layout in an inside of a front compartment 90 of a hybrid car 100. In a coordinate system in the drawing, a forward direction of an F-axis indicates a vehicle front side, and a forward direction of a V-axis indicates a vehicle upper direction. A forward direction of an H-axis indicates a left side of the vehicle. In FIG. 1, devices mounted in the front compartment 90 are shown schematically. In particular, two projections provided in a rear portion of a case of an electrical control unit 10 that is descried in detail later are not shown. Further, a cable connected to a connector (a low-pressure connector 18) in an upper surface of the case is not shown. A "rear portion of the case" is an expression based on a vehicle front-rear direction of the hybrid car 100 in which the electrical control unit 10 is mounted.

An engine 95, a transaxle 30, the electrical control unit 10, an auxiliary battery 5, a radiator 96, and so on are housed in the front compartment 90. Although various other devices are housed in the front compartment 90, those devices are not shown and the description thereof is omitted.

The hybrid car 100 is provided with two motors 7a, 7b and the engine 95 for traveling. The two motors 7a, 7b are housed in a housing of the transaxle 30. A power distribution mechanism and a differential gear are also housed in the transaxle 30 in addition to the two motors 7a, 7b for traveling. The transaxle 30 and the engine 95 are connected with each other, and the power distribution mechanism is a gear set that combines and distributes output torque of the engine 95 and output torque of the motors 7a, 7b. When high torque is required, the power distribution mechanism combines the output torque of the engine 95 and the output torque of the motors 7a, 7b and transmits the combined torque to the differential gear. Also, depending on a situation, the power distribution mechanism divides (splits) the output torque of the engine 95 and transmits divided torque to the differential gear and the motor 7a. In this case, the hybrid car 100 generates electricity with the use of the motor 7a while the hybrid car 100 is traveling with the use of engine torque. The motor 7b also functions as a starter that starts the engine 95. The transaxle 30 can be expressed as a housing that houses the motors 7a, 7b for running.

The engine 95 and the transaxle 30 are connected to each other so that the engine 95 and the transaxle 30 are next to (i.e., adjacent to) each other in a vehicle width direction. The engine 95 and the transaxle 30 are provided on two side members 92, respectively. The side members 92 secure structural strength of the vehicle. In FIG. 1, one of the side members is not shown.

The electrical control unit 10 is fixed on an upper surface of the transaxle 30. The electrical control unit 10 is a device that boosts direct-current power of a main battery (not shown) and also converts the boosted direct-current power into alternate-current power suitable for driving a motor.

Figure 2:
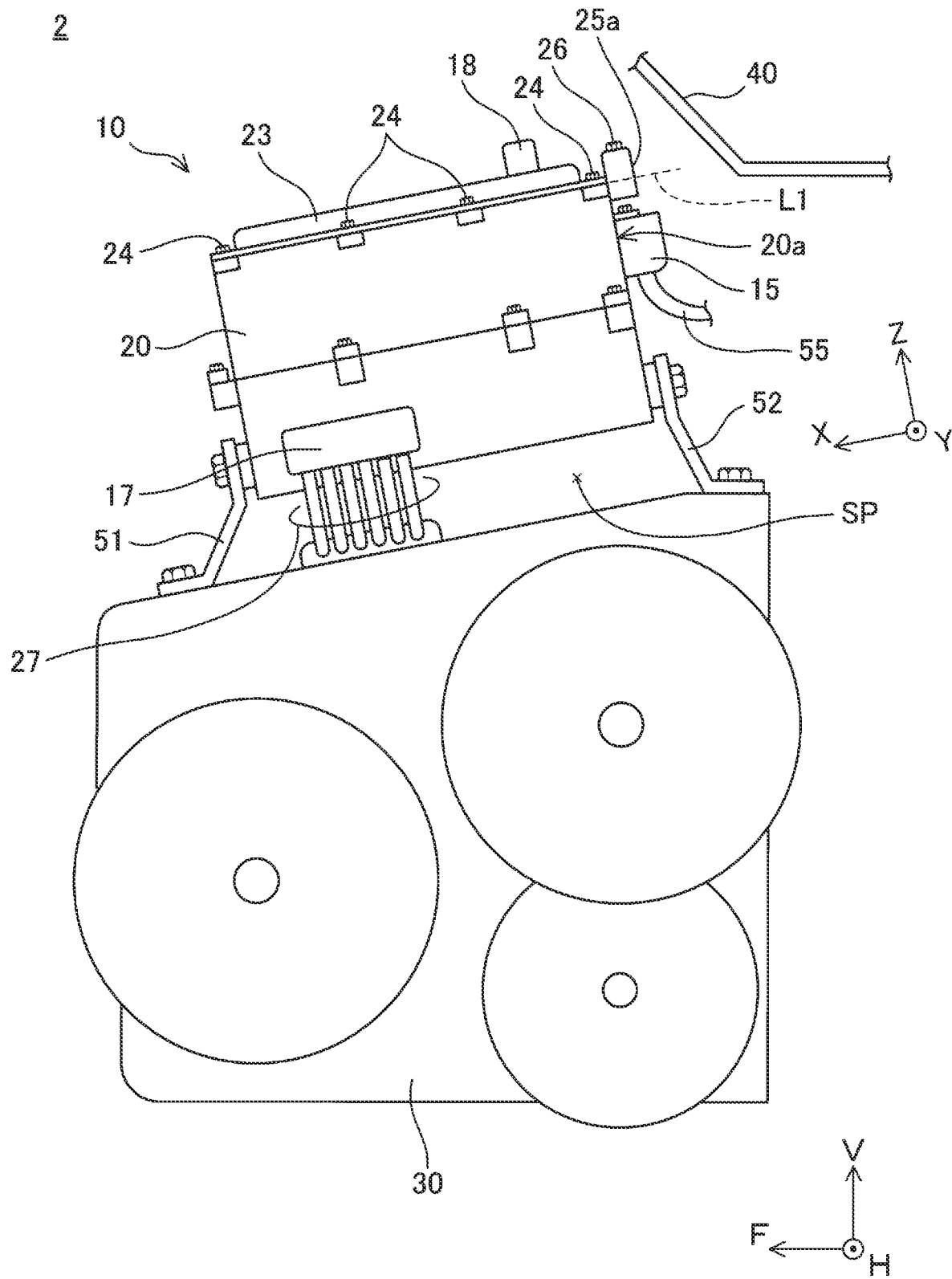
FIG. 2 is a side view of a transaxle and an electrical control unit for which an installation structure in a vehicle according to an embodiment is employed.

FIG. 2 is a side view of the electrical control unit 10 and the transaxle 30 that supports the electrical control unit 10. By using FIG. 2, an installation structure in a vehicle 2 according to the embodiment is described. As stated earlier, the electrical control unit 10 is fixed on the transaxle 30 that is another device installed in the vehicle. The upper surface of the transaxle 30 is inclined such that a front part is low, and the electrical control unit 10 fixed on the transaxle 30 is also disposed in a posture where a front part is low. An XYZ-coordinate system in FIG. 2 is a coordinate system fixed to the electrical control unit 10. The X-axis extends in parallel with a bottom surface of a case 20 of the electrical control unit 10, the Z-axis extends in parallel with a rear surface 20a of the case 20, and the Y-axis extends along the vehicle width direction. The "rear surface 20a" of the case 20 is an expression based on the vehicle front-rear direction of the hybrid car 100 in which the electrical control unit 10 is mounted.

The electrical control unit 10 is fixed by a front bracket 51 and a rear bracket 52 such that there is a space SP between the electrical control unit 10 and the upper surface of the transaxle 30. This configuration is provided to reduce vibration transmitted to the electrical control unit 10 from the transaxle 30. A vibration proof bush (not shown) is sandwiched between the front bracket 51 and the case 20. Also, a vibration proof bush (not shown) is sandwiched between the rear bracket 52 and the case 20. A connector (a motor connector 17) of power cables 27 is connected to a left side surface of the case 20. The power cables 27 send (transmit) electric power to the motors 7a, 7b in the inside of the transaxle 30.

A cover 23 closes an upper portion of the case 20 of the electrical control unit 10. The cover 23 is fixed to the case 20 by a plurality of bolts 24.

The low-pressure connector 18 is connected to a rear portion of the cover 23. The low-pressure connector 18 is a connector that connects a cable to the electrical control unit 10, the cable supplying electric power of the auxiliary battery 5 (see FIG. 1). In FIG. 2, the cable connected to the low-pressure connector 18 is not shown.

A DC-power connector 15 and an air-conditioner connector 16 are connected to the rear surface 20a of the case 20. In FIG. 2, the air-conditioner connector 16 is not visible as the air-conditioner connector 16 is positioned behind the DC-power connector 15 (i.e., the air-conditioner connector 16 is positioned behind the DC-power connector 15 in the Y-axis direction). The DC-power connector 15 is a connector that connects high power supply cables 55 to the electrical control unit 10. The high power supply cables 55 supply electric power of the main battery (not shown). The air-conditioner connector 16 is a connector that connects air-conditioner cables 56 (shown later in FIG. 3) to the electrical control unit 10. Through the air-conditioner cables 56, a part of electric power supplied by the high power supply cables 55 is sent to an air conditioner.

An output voltage of the main battery (not shown) is 100 volt or higher, and an output voltage of the auxiliary battery 5 (see FIG. 1) is 50 volt or lower. Three connectors (the DC-power connector 15, the air-conditioner connector 16, and the motor connector 17) to which a voltage equal to or higher than the output voltage of the main battery is applied, and one connector (the low-pressure connector 18) to which a voltage lower than the output voltage of the main battery is applied are connected to the case 20 of the electrical control unit 10.

The low-pressure connector 18 is connected to the cable supplying electric power of the auxiliary battery 5, and to a communication cable for communicating with a high-level control device. The communication cable is not shown either. The electrical control unit 10 receives a command from the high-level control device through the communication cable. At the time of collision, the electrical control unit 10 receives an emergency shutdown command from the high-level control device through the low-pressure connector 18. Therefore, when the low-pressure connector 18 is damaged before the emergency shutdown command is received, the electrical control unit 10 may not be able to execute the emergency shutdown.

Meanwhile, a cowl panel 40 is positioned rearward of the low-pressure connector 18. When the electrical control unit 10 receives a collision load from the front side at the time of collision, the front and rear brackets 51, 52 are deformed or fractured (broken), and the electrical control unit 10 moves rearward. Then, the low-pressure connector 18 may interfere with the cowl panel 40 and be damaged. Therefore, projections 25a, 25b are provided on the rear surface 20a of the case 20 of the electrical control unit 10. In FIG. 2, the projection 25b is not visible because the projection 25b is positioned behind the projection 25a (i.e., the projection 25b is positioned behind the projection 25a in the Y-axis direction).

Figure 3:
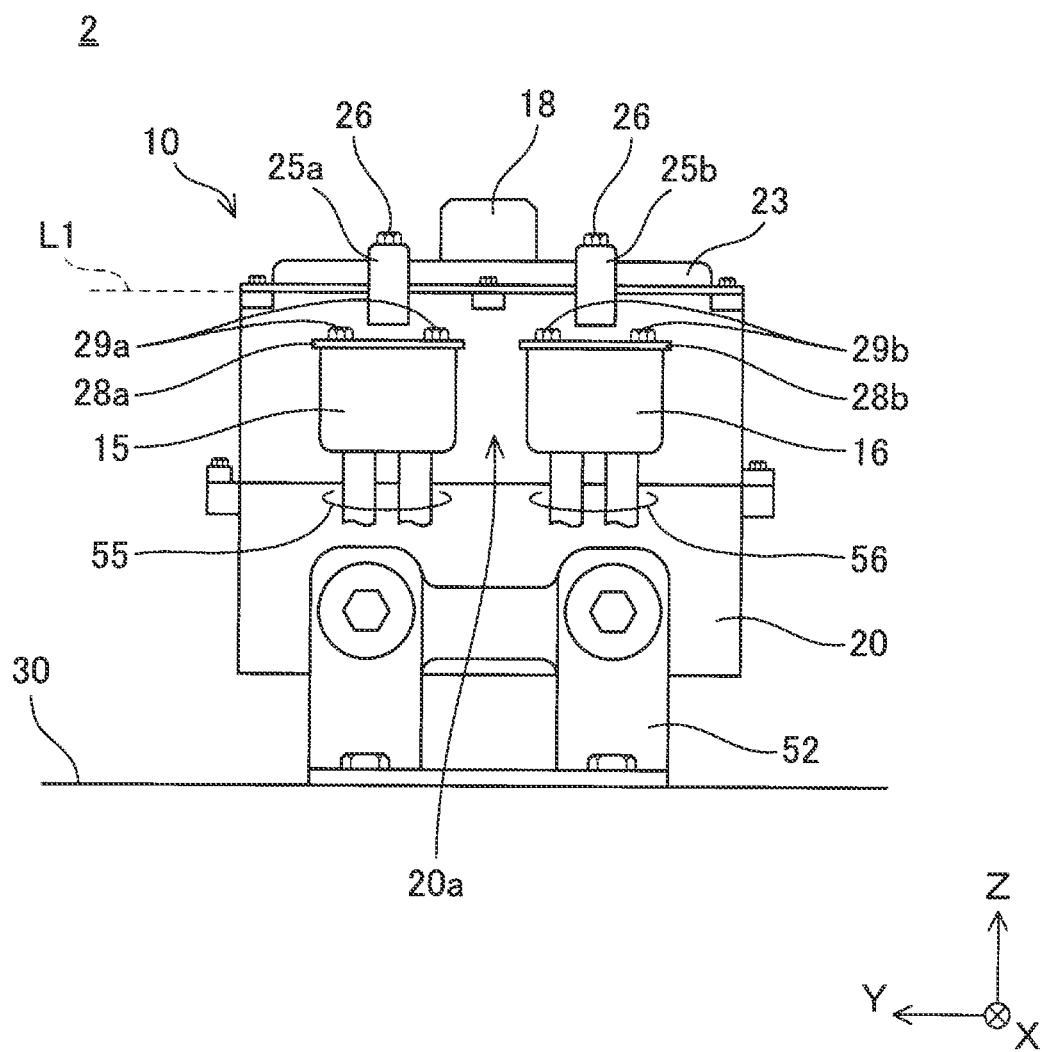
FIG. 3 is a rear view of the electrical control unit.

FIG. 3 is a view of the case 20 seen from the rear side. The projections 25a, 25b extend upward from the rear surface 20a of the case 20. In FIG. 2 and FIG. 3, a broken line L1 shows a boundary between the case 20 and the cover 23. The projections 25a, 25b extend upward to positions above the boundary (the broken line L1) between the case 20 and the cover 23 (i.e., the projections 25a, 25b extend upward beyond the boundary between the case 20 and the cover 23). When the case 20 moves rearward at the time of collision, the projections 25a, 25b come into contact with the cowl panel 40. When the case 20 moves rearward further, the projections 25a, 25b push the cowl panel 40 towards the rear side. Because the projections 25a, 25b push the cowl panel 40 towards the rear side, the cover 23 and the low-pressure connector 18 are protected.

As shown in FIG. 2 and FIG. 3, a rib 28a extends from the rear surface 20a of the case 20, and the DC-power connector 15 is fixed to the rib 28a. The DC-power connector 15 is fixed to the rear surface 20a by two bolts 29a that are inserted into the rib 28a from above. As shown in FIG. 3, the projection 25a extends upward at a position between the two bolts 29a in a view from the rear side. Therefore, the projection 25a does not interfere with the bolts 29a when the bolts 29a are attached and detached.

Similarly, a rib 28b extends from the rear surface 20a of the case 20, and the air-conditioner connector 16 is fixed to the rib 28b. The air-conditioner connector 16 is fixed to the rear surface 20a by two bolts 29b that are inserted into the rib 28b from above. The projection 25b extends upward at a position between the two bolts 29b in a view from the rear side. Therefore, the projection 25b does not interfere with the bolts 29b when the bolts 29b are attached and detached.

Figure 4:
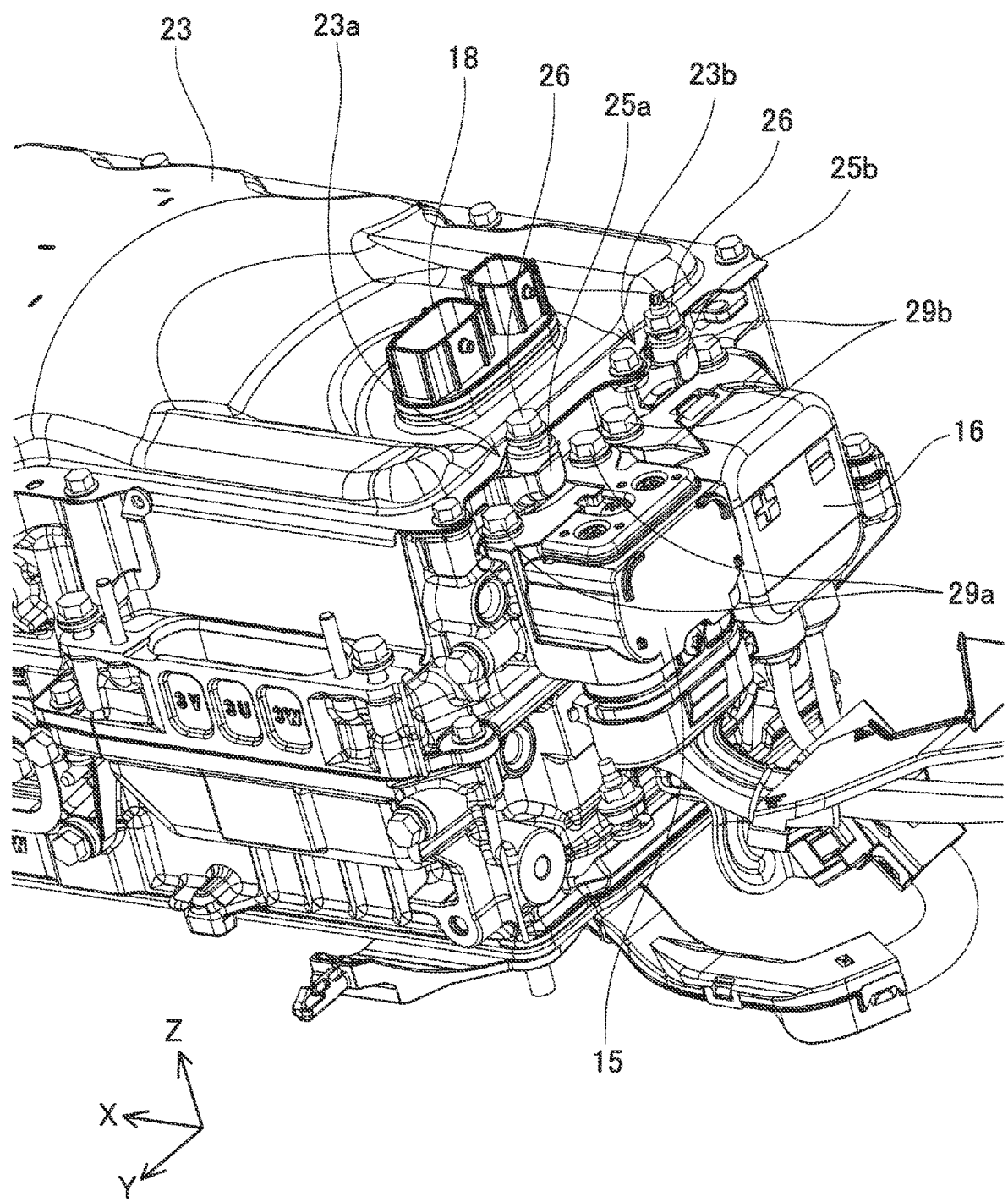
FIG. 4 is a detailed view of a rear portion of the electrical control unit.

FIG. 4 is a detailed view of the rear portion of the case 20. A recess 23a is provided in a rear edge of the cover 23, and the projection 25a extends through the recess 23a. Further, a recess 23b is provided in the rear edge of the cover 23, and the projection 25b extends through the recess 23b. Since the recess 23a (23b) is provided in the cover 23, and the projection 25a (25b) is disposed such that the projection 25a (25b) extends through the recess 23a (23b), the projection 25a (25b) is restrained from protruding toward the rear side of the case. That is, the recesses 23a, 23b contribute to restraining an increase in the size of a body of the case 20 due to addition of the projections 25a, 25b.

Bolts 26 are attached to upper ends of the projections 25a, 25b, respectively. For example, the bolts 26 are used to fasten metal fittings to which cables are locked. Further, bolt holes, in which the bolts 26 of the projections 25a, 25b are fixed, extend through the projections 25a, 25b, respectively.

The case 20 is made by aluminum injection molding. The projections 25a, 25b are part of the case 20, and are formed simultaneously with forming of the case. The projections 25a, 25b may be separate parts from the case 20 (i.e., the projections 25a, 25b may be formed separately from the case 20).

Figure 5:
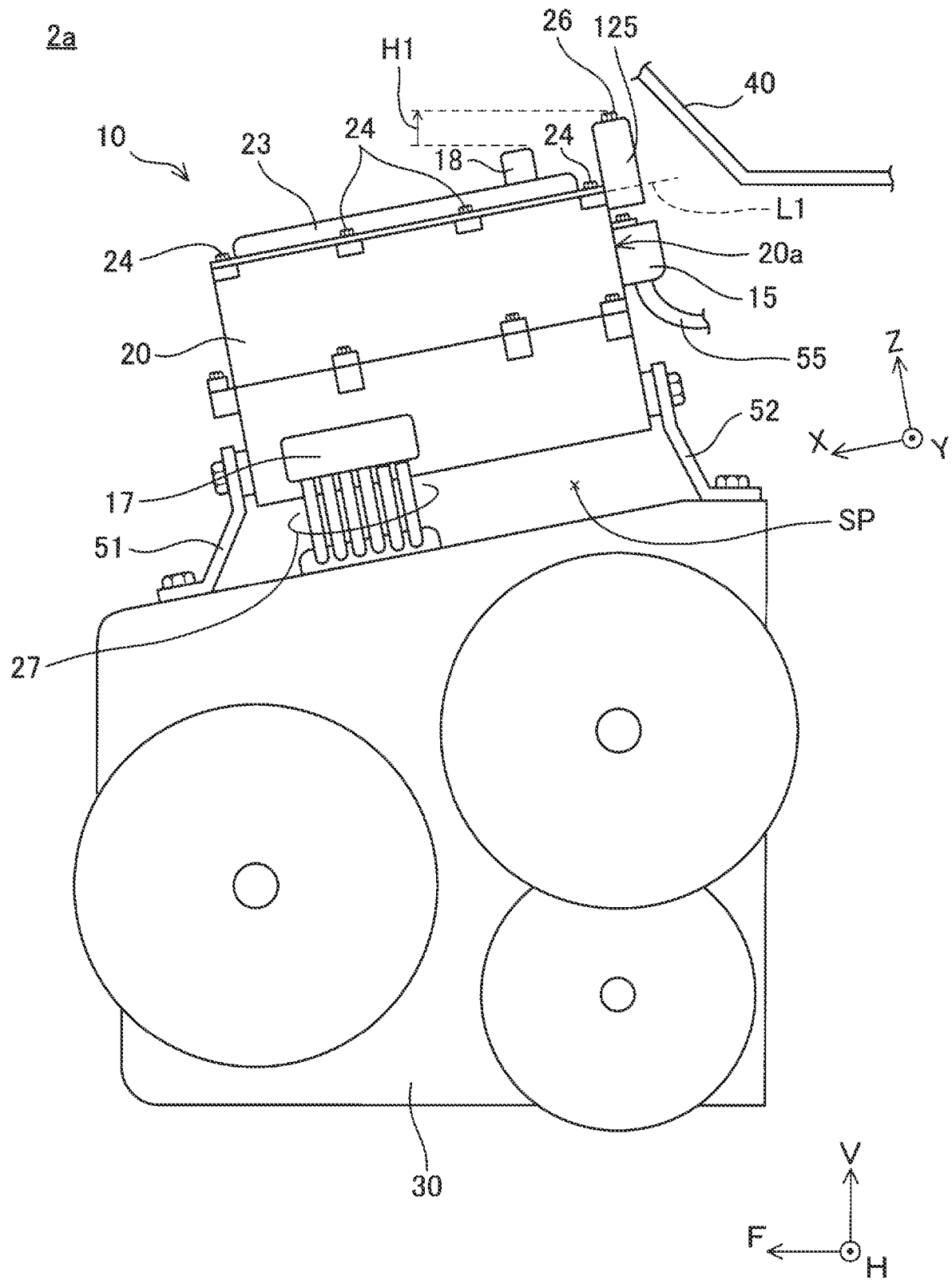
FIG. 5 is a side view of an electrical control unit for which an installation structure in a vehicle according to a modification is employed.

FIG. 5 shows an installation structure in a vehicle 2a according to a modification. In the modification, a projection 125 is provided on a rear surface 20a of a case 20. The projection 125 extends upward to a position above a low-pressure connector 18. In the case of FIG. 5, the projection 125 is higher than the low-pressure connector 18 by a distance H1. By providing the projection 125, the low-pressure connector 18 is protected from interference with the cowl panel 40 more reliably at the time of collision. An electrical control unit 10 is fixed on a transaxle 30 to be in a posture in which a front part of the electrical control unit 10 is low. The projection 125 may extend upwardly to the position above the low-pressure connector 18 in a state where the electrical control unit 10 is mounted in a vehicle (in other words, in the posture in which the front part is low). A bolt 26 is also attached to an upper end of the projection 125. A bolt hole of the projection 125 also extends through the projection 125. The bolt 26 attached to the upper end of the projection 125 is also a part of the projection 125.

Notes are given regarding the technique described in the embodiment. The installation structure in a vehicle in this disclosure is applicable to an electric device other than the electrical control unit. The electric device is not limited to a device fixed on a transaxle. The technique in this disclosure is applicable to an electric device fixed on a structural object in a vehicle (i.e., a vehicle structural object).

In a case where the electrical control unit (the electric device) is fixed in an inclined posture with respect to the horizontal direction, the projection extending from the rear surface may extend upward to a position above the boundary between the case and the cover in the state where the electrical control unit (the electric device) is mounted in a vehicle.

When the bolt is attached to the upper end of the projection, the bolt is also a part of the projection. Thus, when the bolt is attached to the upper end of the projection, an upper end of the bolt may be positioned above the boundary between the case and the cover.

The low-pressure connector 18 is an example of a first connector. The DC-power connector 15 and the air-conditioner connector 16 are examples of a second connector.

The embodiment of the disclosure has been described so far in detail. However, the embodiment is merely illustrative and does not limit the scope of the disclosure. The disclosure includes various modifications and changes that are made to the embodiment described so far. The technical elements described in the disclosure demonstrate technical utility when used singly or in various combinations, and thus the combinations of the technical elements are not limited to the combinations described in the embodiment. In addition, the techniques that are described in the embodiment achieve a plurality of objects simultaneously, and technical utility is provided by achieving at least one of the objects.

What is claimed is:

1. An electric device installation structure in a vehicle, comprising
    an electric device configured to be fixed on a vehicle structural object in a front compartment of a vehicle, wherein
    a cover is attached to an upper part of a case of the electric device,
    a first connector projects from a rear portion of the cover,
    at least two projections provided on a rear surface of the case, the at least two projections extending upward to a position above a boundary between the case and the cover,
    a second connector is fixed to the rear surface of the case by two bolts that are inserted from above, and
    the at least two projections are positioned above the second connector so as to project from the rear surface, and the at least two projections extend upward at a position between the two bolts in a view seen from a rear side.

2. The electric device installation structure according to claim 1, wherein a recess is provided in a rear edge of the cover, and the at least two projections extend through the recess.

3. The electric device installation structure according to claim 1, wherein:
    a rib extends from the rear surface of the case, and the second connector is fixed to the rib; and
    the two bolts are inserted into the rib from above.

4. The electric device installation structure according to claim 1, wherein the at least two projections extend upward to a position above the first connector.

* * * * *